(12) United States Patent
Bereza et al.

(10) Patent No.: US 7,825,527 B2
(45) Date of Patent: Nov. 2, 2010

(54) RETURN LOSS TECHNIQUES IN WIREBOND PACKAGES FOR HIGH-SPEED DATA COMMUNICATIONS

(75) Inventors: William W. Bereza, Nepean (CA); Hong Shi, Santa Rosa, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/139,388

(22) Filed: Jun. 13, 2008

(65) Prior Publication Data

US 2009/0309240 A1    Dec. 17, 2009

(51) Int. Cl.
  H01L 23/48  (2006.01)
  H01L 23/52  (2006.01)
  H01L 29/40  (2006.01)
(52) U.S. Cl. ........................ 257/786; 257/784; 257/692; 257/782; 257/E23.033; 257/E23.037
(58) Field of Classification Search ................. 257/784, 257/786, 692, 782, E23.033, E23.037
See application file for complete search history.

(56) References Cited

U.S. PATENT DOCUMENTS

| | | | | |
|---|---|---|---|---|
| 5,998,869 A | * | 12/1999 | Lin et al. | 257/734 |
| 6,246,107 B1 | * | 6/2001 | Silvestre | 257/666 |
| 6,538,336 B1 | * | 3/2003 | Secker et al. | 257/786 |
| 6,661,101 B2 | * | 12/2003 | Hiraga | 257/786 |
| 7,391,121 B2 | * | 6/2008 | Otremba | 257/784 |
| 2005/0017352 A1 | * | 1/2005 | Lee | 257/728 |
| 2005/0184403 A1 | * | 8/2005 | Inagawa | 257/784 |
| 2006/0175712 A1 | * | 8/2006 | Lyn et al. | 257/784 |
| 2007/0096268 A1 | * | 5/2007 | Sharma et al. | 257/666 |
| 2007/0235874 A1 | * | 10/2007 | Inagawa | 257/738 |
| 2008/0048344 A1 | * | 2/2008 | Lyn et al. | 257/784 |

* cited by examiner

Primary Examiner—Zandra V. Smith
Assistant Examiner—Jeremy J Joy
(74) Attorney, Agent, or Firm—Martine, Penilla & Gencarella, LLP (57) ABSTRACT

A wirebond package configured to reduce wirebond return loss is presented. An integrated circuit of interest with rows of bonding pads is bonded to a surface of the wirebond package. The surface of wirebond package has columns of bonding pads, which are configured to transmit or receive signals, power, and ground to and/or from the wirebond package to the integrated circuit. Corresponding die pads on the integrated circuit and bonding pads of the wirebond package are coupled using conductive lines. The conductive lines carrying the active signal has coplanar adjacent ground lines on opposing sides of active signal line and the distance between active signal line and the coplanar adjacent ground lines is tapered.

19 Claims, 6 Drawing Sheets

RETURN LOSS TECHNIQUES IN WIREBOND PACKAGES FOR HIGH-SPEED DATA COMMUNICATIONS

BACKGROUND OF THE INVENTION

Technology trends moving toward high frequency products have traditionally required the use of flipchip packaging. The use of flipchip packaging comes at the price of increased cost and higher processing complexity. If wirebond package configurations could be improved while maintaining the cost benefits over flipchip packages, several high frequency products designed for flipchip implementation could be packaged using wirebond alternatives. In particular, the effect of inductance of the conductive lines in wirebond packages significantly interferes with meeting return loss specifications in several high frequency applications.

Return loss measures the amount of power that is lost due to reflections and mismatch loss in the conductive line. Return loss is caused by impedance mismatches between the conductive lines (i.e. bondwires) and the bonding pads and the effect impedance mismatches has on signals traversing through the characteristic impedance of the conductive line. The termination of the conductive lines also plays a significant role in determining the return loss on the conductive line, when the characteristic impedance of any part of the conductive line relative to the value of the termination is mismatched. There are two types of return loss: input return loss and output return loss. Signals that are ingress to the integrated circuit (i.e. a receiver circuit) are denoted as having input return loss. Similarly, egress circuits are denoted as having an output return loss. The invention described herein is applicable to both forms of return loss.

Previous methods to reduce return loss due to inductance of wirebonds focused on adding multiple conductive lines in parallel. These methods are hampered by mutual inductance between conductive lines, which limits improvement in the overall inductance. As signal frequencies increase, return loss due to inductance of the signal line becomes a significant problem to overcome.

As a result, there is a need to solve the problems of the prior art to provide a method and apparatus for reducing the return loss of a wirebond package.

SUMMARY OF THE INVENTION

Broadly speaking, the present invention fills these needs by providing a method and apparatus for reducing return loss in a wirebond package by reducing the inductive component in an active signal line. It should be appreciated that the present invention can be implemented in numerous ways, including as a method, a system, or a device. Several inventive embodiments of the present invention are described below.

In accordance with one aspect of the invention, a wirebond package configured to reduce wirebond return loss is provided. An integrated circuit of interest with columns of bonding pads is bonded to a surface of the wirebond package. The surface of wirebond package has columns of bonding pads, which are configured to transmit signals, power, and ground from the wirebond package and receive signals from the integrated circuit and/or vice-versa. Corresponding die pads on the integrated circuit and bonding pads of the wirebond package are coupled using conductive lines (i.e. bondwires). The conductive lines carrying the active signal has coplanar adjacent ground lines on opposing sides of active signal line and the distance between active signal line and the coplanar adjacent ground lines is tapered. In one embodiment, a gap defined between the coplanar ground lines and the conductive line at the die pads is greater than a gap defined between the coplanar ground lines and the conductive line at the bonding pads.

In accordance with another aspect of the invention, a method of reducing return loss in wirebond packaging due to wirebond inductance is detailed. The method begins by providing columns of bonding pads on a surface of a wirebond package and provides rows of die pads on a surface of an integrated circuit. The active signal lines are then connected from the die pads of the integrated circuit to the corresponding bonding pads of the wirebond package. Coplanar ground lines are disposed adjacent and on opposite sides of the active signal line. A planar distance between one of the active signal lines and the coplanar ground lines is tapered toward the bonding pads.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The following embodiments describe an apparatus and method for reducing return loss in a wirebond package by reducing the inductive component in an active signal line. It will be obvious, however, to one skilled in the art, that the present invention may be practiced without some or all of these specific details. In other instances, well known process operations have not been described in detail in order not to unnecessarily obscure the present invention.

Figure 1:
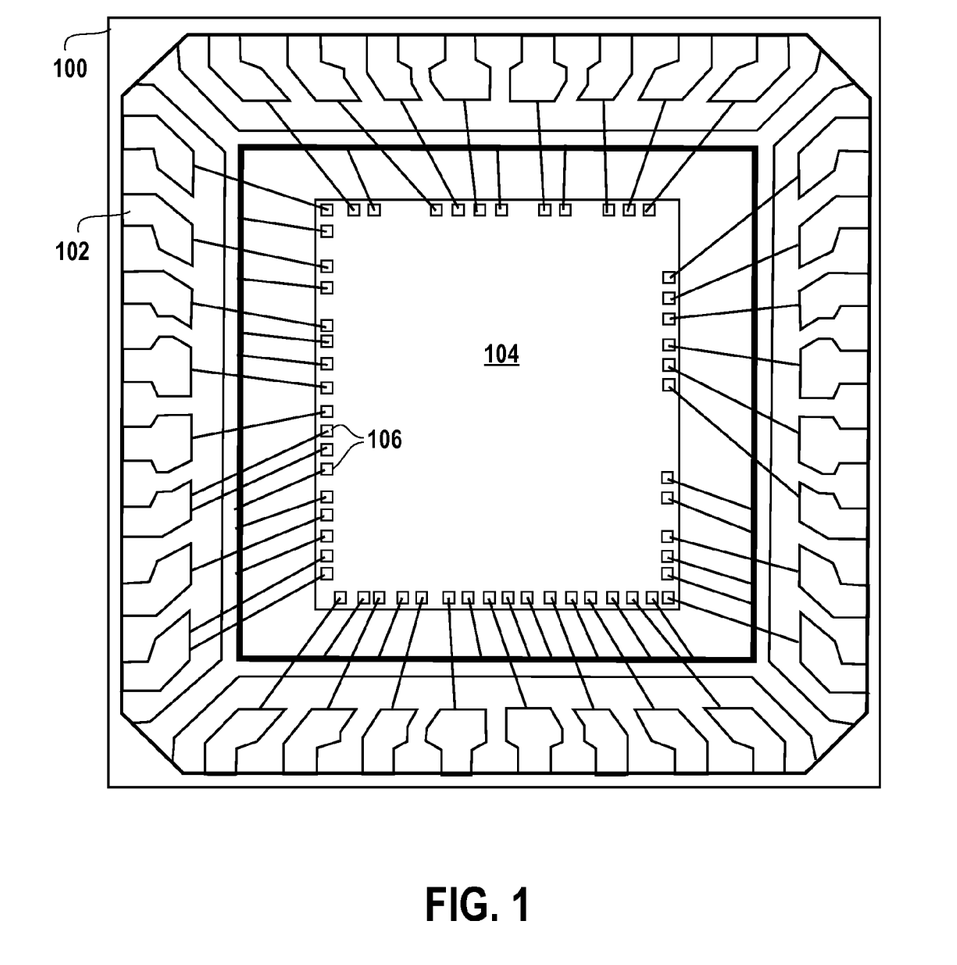
FIG. 1 is a simplified schematic diagram illustrating a wirebond package configured to reduce wirebond return loss in accordance with one embodiment of the present invention.

FIG. 1 illustrates a wirebond package 100 configured to reduce wirebond return loss in accordance with one embodiment of the present invention. The wirebond package is exemplary and it should be noted the following disclosure is applicable to other embodiments of wirebond packages, so long as the essential functions of providing power, ground and input signals, as well as receiving output signals from an integrated circuit are maintained. An integrated circuit 104 is generally, although not necessarily mounted in the center of the wirebond package 100 and a surface of the wirebond package 100 has bonding pads 102. The bonding pads 102 provide a bonding area for one end of the conductive lines connecting the integrated circuit 104 to the wirebond package 100. The other end of the conducting lines is connected to a surface of the integrated circuit 104 through die pads 106. The conductive lines coupling the die pads 106 of the integrated circuit 104 to the bond pads 102 of the wirebond package 100 provide input signals, power, and ground to the integrated circuit. The conductive lines also supply output signals from the integrated circuit 104 to the bonding pads 102.

Figure 2:
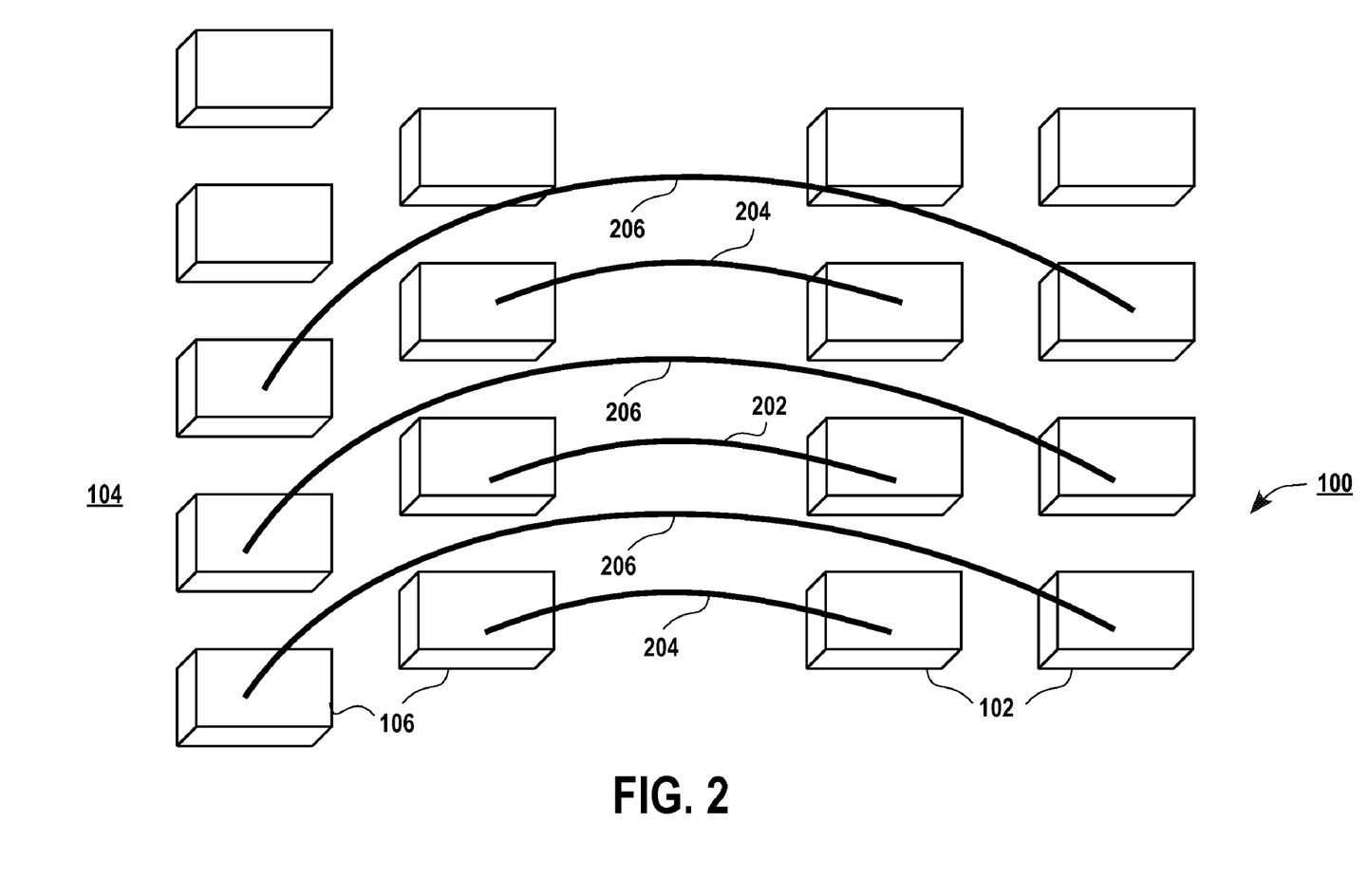
FIG. 2 illustrates a generalized placement of power and ground lines in the wirebond package in accordance with one embodiment of the present invention.

FIG. 2 illustrates a generalized placement of power and ground lines in the wirebond package 100 in accordance with one embodiment of the present invention. In FIG. 2, 100 represents the entire wirebond package. In this embodiment, the die pads 106 are arranged in columns, offset relative to each other, on the surface of the integrated circuit 104. Bonding pads 102 are arranged in columns on the surface of the wirebond package 100. As illustrated in FIG. 2, the columns of bonding pads 102 are in a staggered fashion. While FIG. 2 illustrates one embodiment of the arrangement of bonding pads and die pads into two columns, it should be appreciated depending on the orientation of the wirebond package 100, the term columns can be interchanged with rows. A plurality of conductive lines are coupled to corresponding die pads 106 on the integrated circuit 104 and bonding pads 102 of the wirebond package 100. The plurality of conductive lines include, ground lines 204 that confine the active signal line 202 on opposing sides. Conductive ground lines 204 are also substantially coplanar relative to the active signal line 202. The active signal line 202 is confined from above by conductive lines 206 carrying either power or ground. Typically this coplanar configuration of the ground lines 204 would be used for active signal lines which carry high speed signals.

Placing ground lines 204 in such a way as to be substantially coplanar relative to the active signal line 202 causes the active signal line 202 to take on behavior of a coplanar waveguide. Once the active signal line 202 is manipulated to behave as a coplanar waveguide, the characteristic impedance behavior of the active signal line 202 can be modified. The characteristic impedance of the active signal line 202 can be modified to more closely match the characteristic impedance of the termination on the active signal line 202.

The behavior of the coplanar waveguide is governed by the width of the active signal line 202 and the distance to the coplanar grounded lines 204. By way of example, if a gap between bonding pads 102 and a gap between die pads 106 is 100 microns and an active signal line 202 with diameter of 0.0254 millimeters, the characteristic impedance of the active signal line 202 for the coplanar configuration is approximately 150 ohms.

The conductive signal lines 206 carrying power or ground above the active signal line 202 also reduce the characteristic impedance of the active signal line 202. The reduction of the characteristic impedance by the conductive signal lines 206 carrying power or ground depends on the distance from the active signal line 202 to the conductive lines 206 carrying power or ground. Additionally, the presence of the conductive lines 206 carrying power or ground above the active signal line 202 offers some crosstalk protection and improved current return paths.

Figure 3:
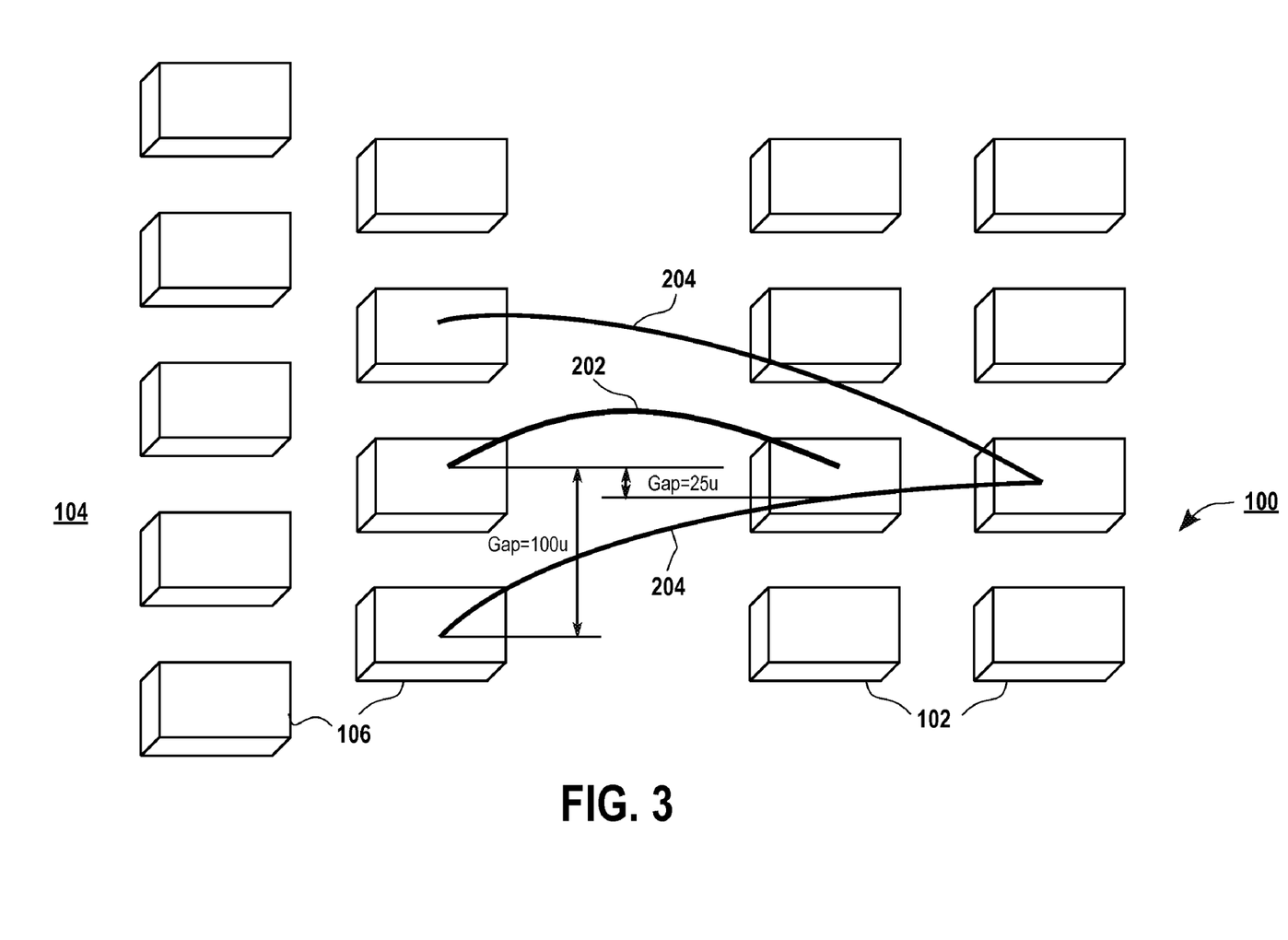
FIG. 3 illustrates the tapered placement of ground lines on the wirebond package, where the ground lines couple to the same bonding pad on the wirebond package in accordance with one embodiment of the present invention.

Reducing the distance between the coplanar ground lines 204 and the active signal line 202 decreases the return loss of the active signal line 202. This distance can be substantially reduced by tapering the distance between coplanar ground lines 204 relative to the signal conductive line 202. FIG. 3 illustrates the tapered placement of ground lines 204 on the wirebond package 100, where the ground lines 204 couple to the same bonding pad 102 on the wirebond package 100 in accordance with one embodiment of the present invention.

Coupling one end of the conductive ground lines 204 to the same bonding pad 102 in a different column than the bonding pad 102 used by the active signal line 202 tapers the distance between the active signal line and the coplanar ground line. The distance between the conductive ground lines 204 and the active signal line 202 is smaller toward the bond pads 102 of the wirebond package 100 and larger toward the die pads 106 of the integrated circuit 104. By way of example, for a gap between bonding pads 102 and a gap between die pads 106 of 100 microns, the distance between the active signal line 202 and the coplanar adjacent ground line 204 tapers from about 100 microns near the die pads 106 to about 25 microns near the bonding pads 102. The conductive ground lines 204 are substantially coplanar relative to the active signal line 202, which allows this tapered configuration of the conductive ground lines 204 and the active signal line 202 to take on the behavior of a coplanar waveguide. In general, the gap distances are determined to get the characteristic impedance of the coplanar waveguide bondwires matching the impedance of the conductive line termination. Practical limits from bonding machines, design rules as set forth by the package and integrated circuit manufacturer for a given process node may change and limit matching to the ideal characteristic impedance.

Figure 4A:
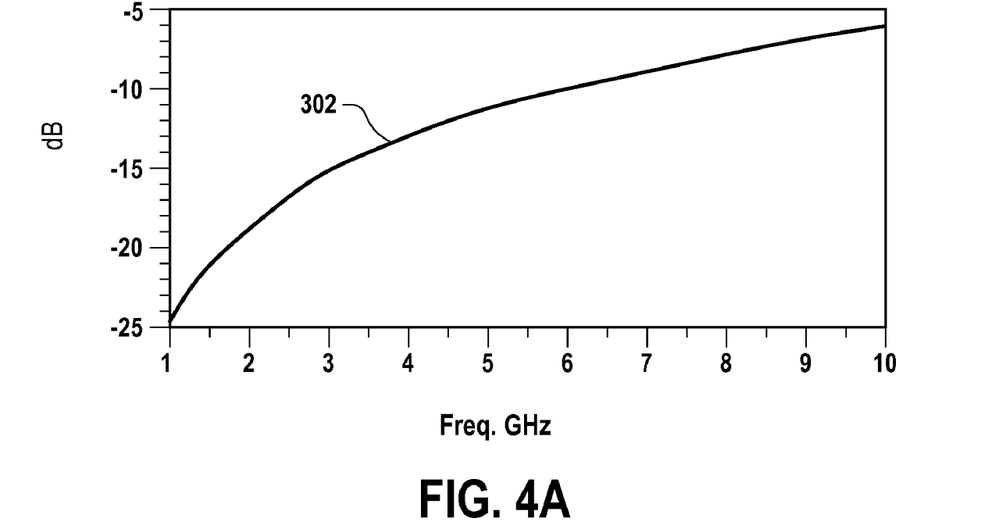
FIG. 4A is a graph illustrating a simulation of the return loss in the active signal line when the coplanar ground lines are parallel to the active signal line in accordance with one embodiment of the present invention.

FIG. 4A illustrates an exemplary simulation of the return loss in the active signal line when the coplanar ground lines are parallel to the active signal line in accordance with one embodiment of the present invention. The simulation used an active signal line length of 2 mm with a 50 ohm termination. The simulated return loss for the coplanar waveguide configuration illustrated by line 302 is approximately −10 dB at a frequency of 5 GHz. The active signal line length and termination used in the simulations are for illustrative purposes and are not meant to limiting.

Figure 4B:
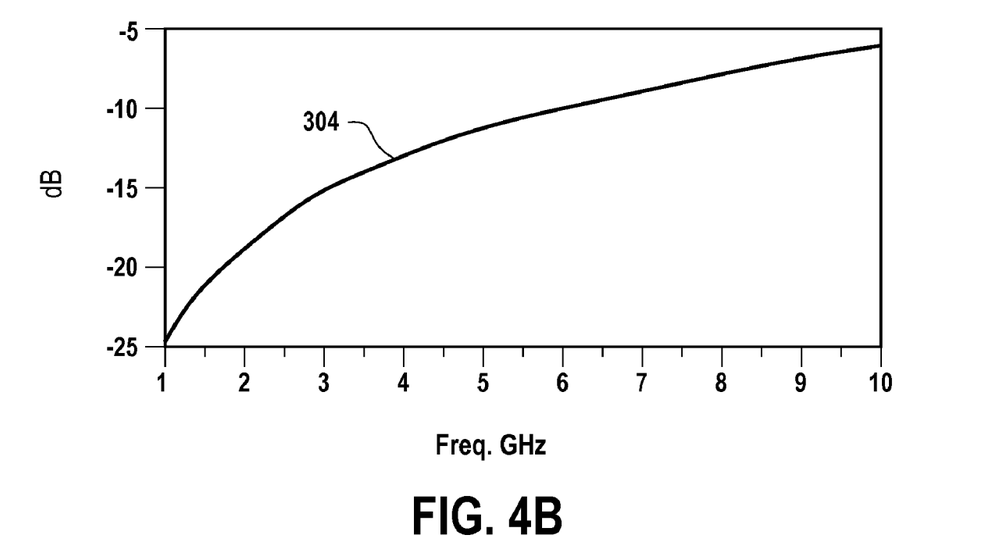
FIG. 4B is a graph illustrating a simulation of the return-loss in the active signal line where the distance between the coplanar conductive ground lines and the active signal line is tapered in accordance with one embodiment of the present invention.

FIG. 4B illustrates a simulation of the return-loss in the active signal line where the distance between the coplanar conductive ground lines 204 and the active signal line is tapered in accordance with one embodiment of the present invention. The simulation used active signal line length of 2 mm and a 50 ohm termination. The simulated return loss for the tapered waveguide configuration illustrated by the line 304 is approximately −14 dB at a frequency of 5 GHz. This can be compared to the simulated return loss for the coplanar waveguide configuration 302 of FIG. 4A approximately −10 dB at 5 GHz. As illustrated through a comparison of FIGS. 4A and 4B, the return loss for the tapered configuration decreases relative to the coplanar configuration due to reduced inductive characteristics in the active signal line. It should be appreciated that the return loss is not adversely affected by the continual change in the characteristic impedance as a function of position of the active signal line arising from tapering the distance between the active signal line and the coplanar ground lines.

Figure 5:
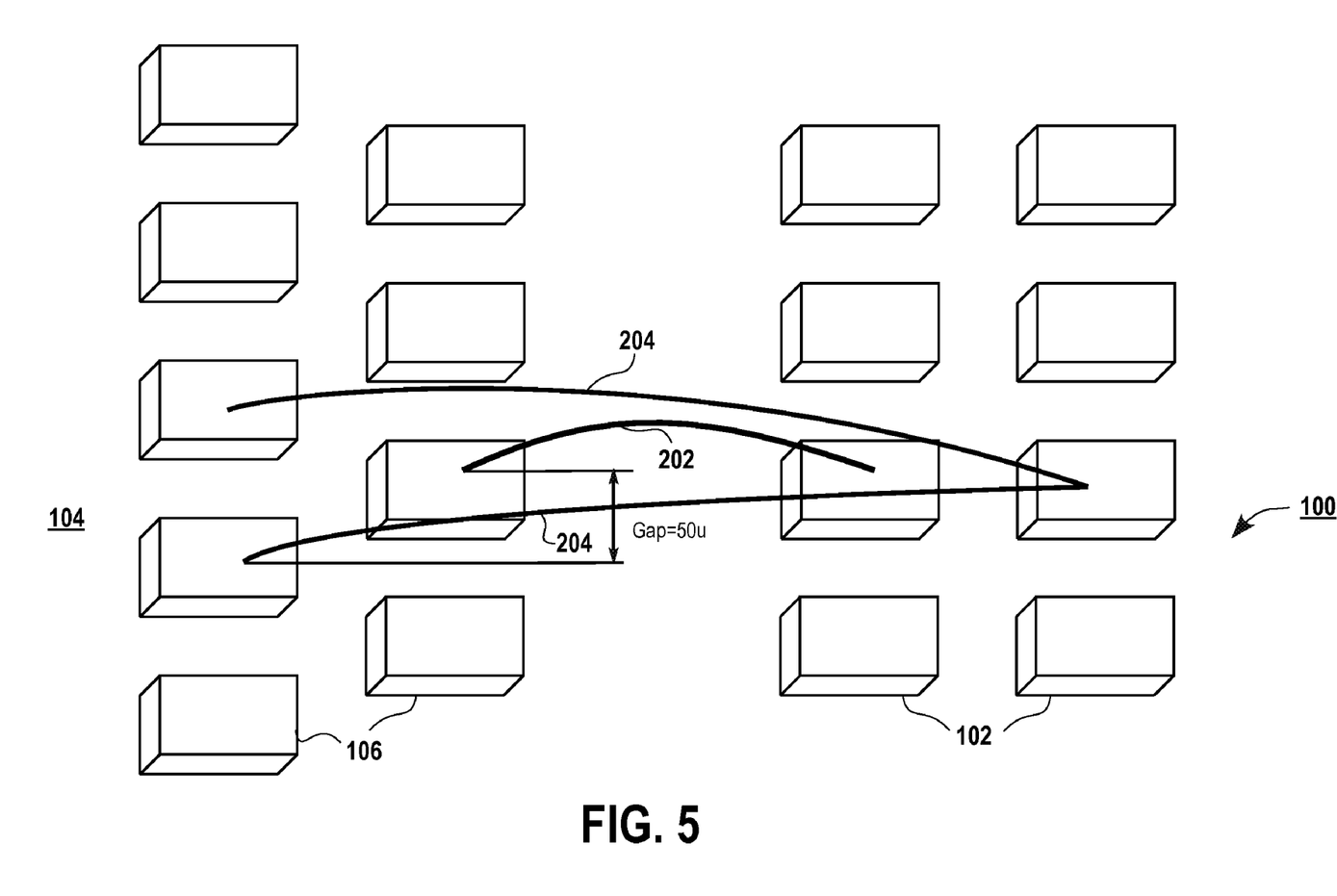
FIG. 5 illustrates the placement of ground lines on staggered columns of die pads on the surface of the integrated circuit in accordance with one embodiment of the present invention.

By utilizing the offset column of die pads 106 on the surface of the integrated circuit 104, the gap between coplanar ground lines 204 relative to the active signal line 202 can be further reduced. FIG. 5 illustrates the placement of ground lines on staggered columns of die pads 106 on the surface of the integrated circuit 104. Coplanar ground lines 204 emanate from a column of die pads 106 different than the column of die pads 106 coupling the signal line 206 in accordance with one embodiment of the present invention. The gap between the active signal line 202 and the coplanar ground lines 204 is tapered from the die pads 106 on the integrated circuit 104 down to the bonding pads 102 of the wirebond package 100. For illustrative purposes, assuming the pitch of the die pads 106 and the bonding pads 102 is 100 microns, the distance between staggered die pads 106 relative to the active signal line is about 50 microns near the bonding pads 102. As the gap tapers towards the bonding pads 102, the distance between the coplanar ground lines 204 and the active signal line 202 decreases from about 50 microns to about 20 microns.

Figure 6:
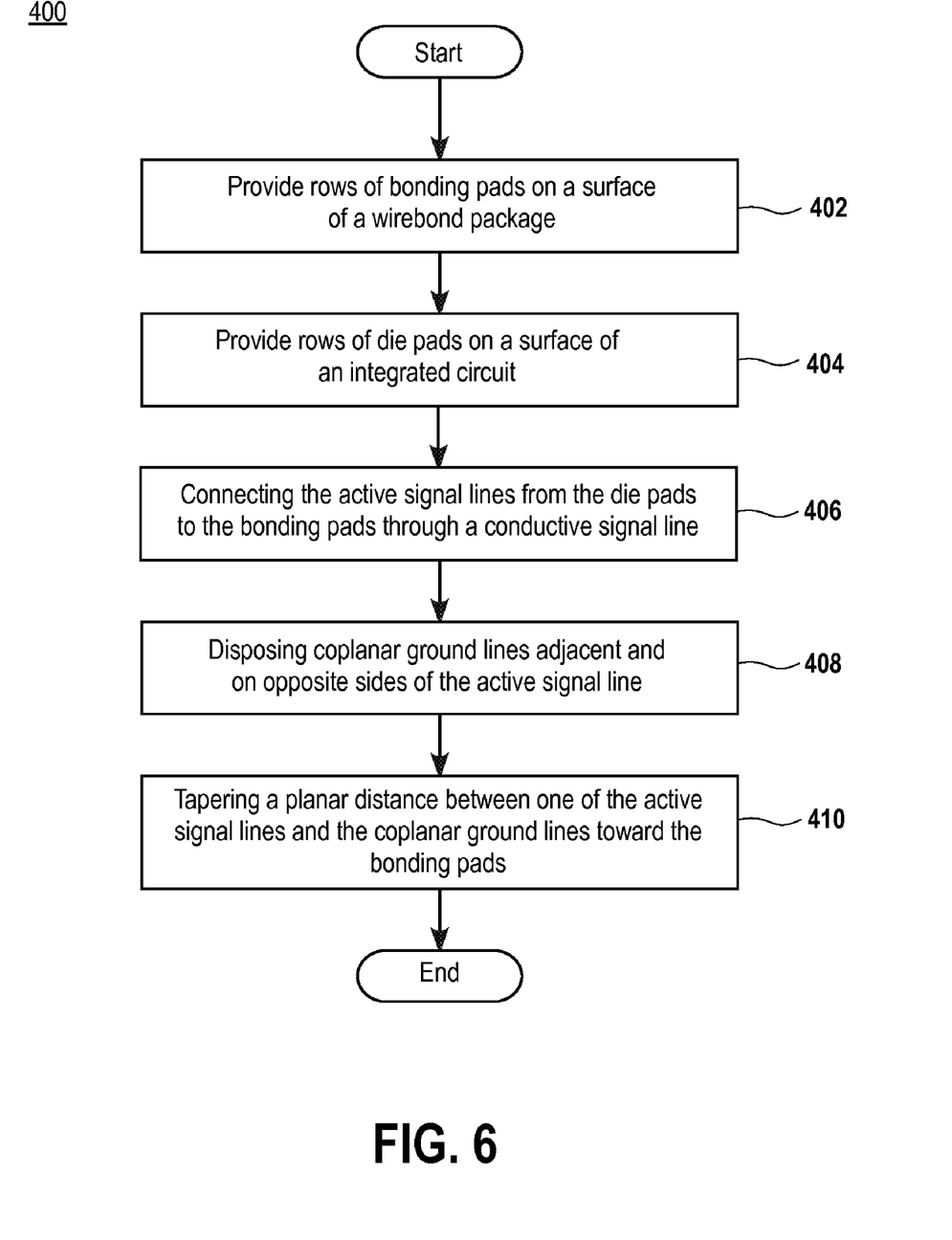
FIG. 6 is a flow chart diagram illustrating method operations for reducing return loss in wirebond packaging due to wirebond inductance in accordance with one embodiment of the present invention.

FIG. 6 is a flow chart diagram 400 illustrating method operations for reducing return loss in wirebond packaging due to wirebond inductance, in accordance with one embodiment of the present invention. The method begins with operation 402, in which a plurality of columns of bonding pads on a surface of a wirebond package is provided. It should be appreciated columns of bonding pads and die pads are also configured into rows, depending on the orientation of the wirebond package, as illustrated in FIG. 1. In operation 404, a plurality of columns of die pads on a surface of an integrated circuit are provided. In one embodiment, the plurality of columns of die pads is staggered on the surface of the integrated circuit relative to each other, as illustrated in FIG. 2. Each active signal line is connected from one of the die pads of the integrated circuit to one of the bonding pads of the wirebond package through a conductive signal line in operation 406, as illustrated in FIG. 2. The method then advances to operation 408, which disposes coplanar adjacent ground lines on opposite sides of the active signal line. In one embodiment, conductive lines carrying power or ground are also disposed above the active signal line, as illustrated in FIG. 2. Lastly, operation 410 tapers the planar distance between the active signal line and the coplanar ground lines toward the bonding pads. In one embodiment, tapering the planar distance is achieved by connecting the coplanar ground lines to the same bonding pad of the wirebond package, as illustrated in FIG. 3. Alternately, tapering the planar distance is achieved by disposing of the coplanar ground lines on a column of die pads different than the column of die pads connecting the active signal line and connecting the ground lines to the same bonding pad of the wirebond package, as illustrated in FIG. 5.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A wirebond package, comprising:
    an integrated circuit bonded to a surface of the wirebond package;
    a plurality of columns of bonding pads on a surface of the wirebond package, the plurality of columns of bonding pads configured to transmit signals, power, and ground from the wirebond package and receive signals from the integrated circuit;
    a plurality of conductive lines coupled to corresponding die pads on the integrated circuit and the bonding pads on the wirebond package, wherein one of the conductive lines has substantially coplanar adjacent ground lines on opposing sides of the one of the conductive lines, and wherein a distance between the one of the conductive lines and the coplanar adjacent ground lines is tapered such that the distance is smaller toward the bonding pads of the wirebond package and larger toward the die pads of the integrated circuit, wherein the corresponding die pads on the integrated circuit are located on an outermost column of multiple columns of die pads.

2. The wirebond package of claim 1 further configured to couple the coplanar adjacent ground lines to a same bonding pad on the wirebond package, the bonding pad located within an inner column of the plurality of columns of bonding pads.

3. The wirebond package of claim 1 wherein the substantially coplanar adjacent ground lines emanate from a column of die pads that is different than a column of die pads from which the one of the conductive lines emanates.

4. The wirebond package of claim 1, further configured to couple with the die pads of the integrated circuit, wherein the die pads of adjacent column on the integrated circuit are offset relative to each other.

5. The wirebond package of claim 1, wherein the distance between the one of the conductive lines and the substantially coplanar adjacent ground line tapers from about 100 microns to about 25 microns.

6. The wirebond package of claim 1, wherein the distance between the one of the conductive lines and the substantially coplanar adjacent ground line tapers from about 50 microns to about 20 microns and wherein the die pads of adjacent columns are offset.

7. A wirebond package, comprising:
    an integrated circuit bonded to a surface of the wirebond package;
    a plurality of columns of bonding pads on a surface of the wirebond package;
    a conductive line coupling a die pad of the integrated circuit to one of the bonding pads, the conducting line configured to carry an active signal; and
    substantially coplanar ground lines adjacent to the conductive line, wherein a gap defined between the coplanar ground lines and the conductive line at corresponding die pads is greater than a gap defined between the coplanar ground lines and the conductive line at the bonding pads, and wherein the die pad and the corresponding die pads on the integrated circuit are located on an outermost column of multiple columns of die pads.

8. The wirebond package of claim 7, wherein the gap between the conductive line and the coplanar ground line tapers.

9. The wirebond package of claim 8, wherein the gap between the conductive line and the coplanar ground line is reduced towards the bonding pads of the wirebond package and is larger toward the die pads of the integrated circuit.

10. The wirebond package of claim 7 further configured to couple the coplanar ground lines to a same bonding pad on the wirebond package, the same bonding pad located within an inner column of the plurality of columns of bonding pads.

11. The wirebond package of claim 7 wherein the substantially coplanar ground lines emanate the die pad in a column different than the column of die pads coupling the conductive line.

12. The wirebond package of claim 7, further configured to couple with the die pads of the integrated circuit, wherein the die pads of adjacent columns on the integrated circuit are staggered relative to each other.

13. The wirebond package of claim 9, wherein the distance between the conductive line and the coplanar ground line tapers from about 100 microns to about 25 microns.

14. The wirebond package of claim 9, wherein the distance between the conductive line and the coplanar ground line tapers from about 50 microns to about 20 microns using staggered die pads on a column different than the column of die pads coupling the conductive line.

15. A wirebond package for an integrated circuit, prepared by a process comprising:
connecting an active signal line from a die pad of the integrated circuit to a bonding pad of the wirebond package;
disposing coplanar ground lines adjacent and to each side of the active signal line; and
tapering a planar distance between the active signal line and the coplanar ground lines toward the bonding pads such that the planar distance is smaller toward the bonding pads of the wirebond package and larger toward the die pads of the integrated circuit, the die pads on the integrated circuit are located on an outermost column of multiple columns of die pads.

16. The wirebond package of claim 15, further comprising:
staggering die pads of adjacent columns on a surface of the integrated circuit.

17. The wirebond package of claim 15, further comprising:
disposing the coplanar ground lines on die pads from an adjacent column to the die pad.

18. The wirebond package of claim 15, further comprising:
connecting the coplanar ground lines to a same bonding pad of the wirebond package, the same bonding pad located within an inner column of a plurality of columns of bonding pads.

19. The wirebond package of claim 15 wherein a distance between the active signal line and each of the coplanar ground lines tapers from about 50 microns to about 20 microns.

* * * * *